(12) United States Patent
Zhu et al.

(10) Patent No.: US 12,744,100 B2
(45) Date of Patent: Sep. 22, 2026

(54) MEMORY DEVICE AND MEMORY TESTING

(71) Applicant: SigmaStar Technology Ltd., Xiamen (CN)

(72) Inventors: Cheng Jie Zhu, Xiamen (CN); Cheng Hung Tsai, Xiamen (CN); Kuei Hung Cheng, Xiamen (CN); Chia Ho Pan, Xiamen (CN); Jian Na Shen, Xiamen (CN)

(73) Assignee: SIGMASTAR TECHNOLOGY LTD., Xiamen (CN)

(*) Notice: Subject to any disclaimer, the term of this patent is extended or adjusted under 35 U.S.C. 154(b) by 96 days.

(21) Appl. No.: 18/926,529

(22) Filed: Oct. 25, 2024

(65) Prior Publication Data

US 2025/0149104 A1 May 8, 2025

(30) Foreign Application Priority Data

Nov. 2, 2023 (CN) ......................... 202311451331.2

(51) Int. Cl.
*G11C 29/36* (2006.01)
*G11C 29/38* (2006.01)

(52) U.S. Cl.
CPC .............. *G11C 29/36* (2013.01); *G11C 29/38* (2013.01); *G11C 2029/3602* (2013.01)

(58) Field of Classification Search
CPC ......... G11C 29/38; G11C 29/44; G11C 29/10; G11C 29/36; G11C 2029/3602; G11C 2029/0405
See application file for complete search history.

(56) References Cited

U.S. PATENT DOCUMENTS 7,266,028 B1 * 9/2007 Ghosh Dastidar ..... G11C 29/44 365/201

* cited by examiner

*Primary Examiner* — Woo H Choi
(74) *Attorney, Agent, or Firm* — Edell, Shapiro & Finnan LLC

(57) ABSTRACT

A memory testing method includes the operations of: generating test pattern data, a test address and reference data by a pattern generating circuit; performing a built-in self-test (BIST) according to the test pattern, the test address and the reference data by multiple memory modules to generate multiple test results; generating an indicator signal according to the multiple test results; when a first test result among the multiple test results indicates a fault, retaining the test address by the pattern generating circuit in response to the indicator signal, and testing, according to the test address and multiple sets of predetermined pattern data, a first memory module among the multiple memory modules that corresponds to the first test result to generate a localization test result; and determining a faulty memory cell in the first memory module according to the localization test result.

13 Claims, 6 Drawing Sheets

| Predetermined pattern data PP | Bit B3 | Bit B2 | Bit B1 | Bit B0 |
|---|---|---|---|---|
| 0 | 0 | 0 | 0 | 0 |
| F | 1 | 1 | 1 | 1 |
| A | 1 | 0 | 1 | 0 |
| 5 | 0 | 1 | 0 | 1 |
| 3 | 0 | 0 | 1 | 1 |
| C | 1 | 1 | 0 | 0 |

For testing stuck-at fault having value stuck at 1

FIG. 3A

| Weighting | 32 | 16 | 8 | 4 | 2 | 1 | |
|---|---|---|---|---|---|---|---|
| Predetermined pattern data PP | 0 | F | A | 5 | 3 | C | Weighting sum |
| Bit B0 (stuck at 0) | | 1 | | 1 | 1 | | 22 |
| Bit B0 (stuck at 1) | 1 | | 1 | | | 1 | 41 |
| Bit B1 (stuck at 0) | | 1 | 1 | | 1 | | 26 |
| Bit B1 (stuck at 1) | 1 | | | 1 | | 1 | 37 |
| Bit B2 (stuck at 0) | | 1 | 1 | | 1 | | 21 |
| Bit B2 (stuck at 1) | 1 | | | 1 | | 1 | 42 |
| Bit B3 (stuck at 0) | | 1 | 1 | | | 1 | 25 |
| Bit B3 (stuck at 1) | 1 | | | 1 | 1 | | 38 |

1: Test result indicating fault

FIG. 3B

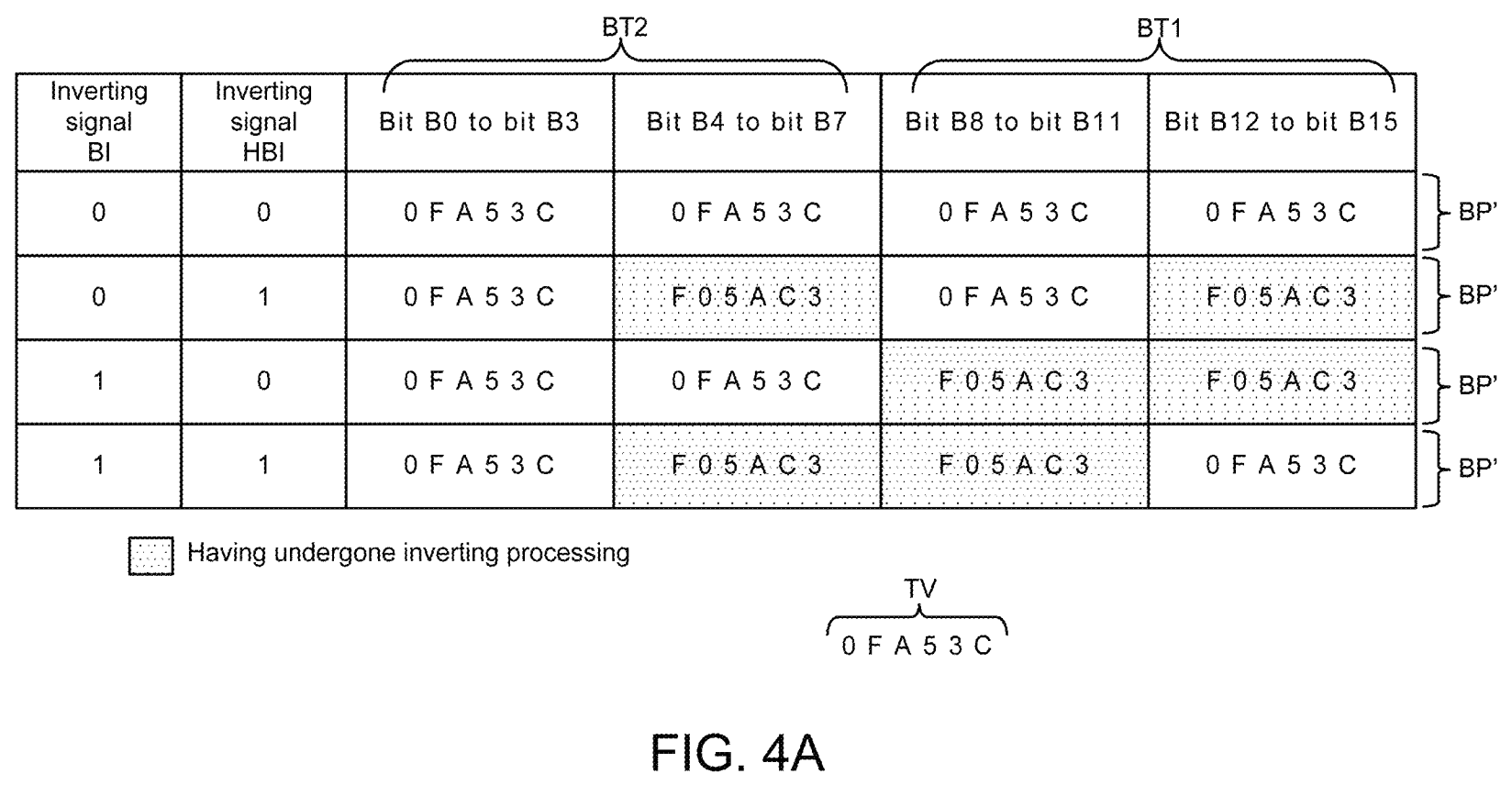

| Inverting signal BI | Inverting signal HBI | Bit B0 to bit B3 | Bit B4 to bit B7 | Bit B8 to bit B11 | Bit B12 to bit B15 |
| --- | --- | --- | --- | --- | --- |
| 0 | 0 | 0 F A 5 3 C | 0 F A 5 3 C | 0 F A 5 3 C | 0 F A 5 3 C |
| 0 | 1 | 0 F A 5 3 C | F 0 5 A C 3 | 0 F A 5 3 C | F 0 5 A C 3 |
| 1 | 0 | 0 F A 5 3 C | 0 F A 5 3 C | F 0 5 A C 3 | F 0 5 A C 3 |
| 1 | 1 | 0 F A 5 3 C | F 0 5 A C 3 | F 0 5 A C 3 | 0 F A 5 3 C |

FIG. 4A

| | Inverting signal BI | Inverting signal HBI | | | | | | |
|---|---|---|---|---|---|---|---|---|
| S51 | 0 | 0 | 0 | F | A | 5 | 3 | C |
| S52 | 0 | 1 | 0 | F | A | 5 | 3 | C |
| S53 | 1 | 0 | 0 | F | A | 5 | 3 | C |
| S54 | 1 | 1 | 0 | F | A | 5 | 3 | C |

Test result indicating fault

FIG. 4B

MEMORY DEVICE AND MEMORY TESTING

This application claims the benefit of China application Serial No. CN202311451331.2, filed on Nov. 2, 2023, the subject matter of which is incorporated herein by reference.

BACKGROUND OF THE INVENTION

Field of the Invention

The present application relates to a memory device, and more particularly to a memory device and a memory testing method capable of locating a faulty memory cell and a fault type thereof.

Description of the Related Art

In current memory test solutions, if a memory is to be tested to locate a faulty memory cell, multiple logic circuits and decoding circuits are needed to process test information of the memory. Thus, significant circuit delay is introduced and the overall circuit area is increased, causing circuit congestion as well as greatly increased memory testing costs.

SUMMARY OF THE INVENTION

In some embodiments, it is an object of the present application to provide a memory device and a memory testing method capable of locating a faulty memory cell and a fault type thereof so as to improve the drawbacks of the prior art.

In some embodiments, the memory device includes a pattern generating circuit, a plurality of memory modules and a logic circuit. The pattern generating circuit generates test pattern data, a test address and reference data. The plurality of memory modules perform a built-in self-test (BIST) according to the test pattern data, the test address and the reference data to generate a plurality of test results. The logic circuit generates an indicator signal according to the plurality of test results. When a first test result among the plurality of test results indicates a fault, the pattern generating circuit retains the test address in response to the indicator signal, and tests, according to the test address and a plurality of sets of predetermined pattern data, a first memory module among the plurality of memory modules that corresponds to the first test result, so as to determine a faulty memory cell in the first memory module according to a localization test result generated by the first memory module based on the plurality of sets of predetermined pattern data.

In some embodiments, a memory testing method includes the operations of: generating, by a pattern generating circuit, test pattern data, a test address and reference data; performing, by a plurality of memory modules, a built-in self-test (BIST) according to the test pattern, the test address and the reference data to generate a plurality of test results; generating an indicator signal according to the plurality of test results; when a first test result among the plurality of test results indicates a fault, retaining, by the pattern generating circuit, the test address in response to the indicator signal, and testing, according to the test address and a plurality of sets of predetermined pattern data, a first memory module among the plurality of memory modules that corresponds to the first test result to generate a localization test result; and determining a faulty memory cell in the first memory module according to the localization test result.

Features, implementations and effects of the present application are described in detail in preferred embodiments with the accompanying drawings below.

BRIEF DESCRIPTION OF THE DRAWINGS

To better describe the technical solution of the embodiments of the present application, drawings involved in the description of the embodiments are introduced below. It is apparent that, the drawings in the description below represent merely some embodiments of the present application, and other drawings apart from these drawings may also be obtained by a person skilled in the art without involving inventive skills.

FIG. 3A is a schematic diagram of results of column detection performed on a column of memory cells according to multiple sets of predetermined pattern data according to some embodiments of the present application;

FIG. 3B is a schematic diagram of a localization test result generated based on multiple sets of predetermined pattern data according to some embodiments of the present application;

FIG. 4A is a schematic diagram of test data combined from multiple inverting signals and multiple sets of predetermined pattern data according to some embodiments of the present application; and FIG. 4B is a schematic diagram of a localization test result generated based on the test data in FIG. 4A according to some embodiments of the present application.

DETAILED DESCRIPTION OF THE INVENTION

All terms used in the literature have commonly recognized meanings. Definitions of the terms in commonly used dictionaries and examples discussed in the disclosure of the present application are merely exemplary, and are not to be construed as limitations to the scope or the meanings of the present application. Similarly, the present application is not limited to the embodiments enumerated in the description of the application.

The term "coupled" or "connected" used in the literature refers to two or multiple elements being directly and physically or electrically in contact with each other, or indirectly and physically or electrically in contact with each other, and may also refer to two or more elements operating or acting with each other. As given in the literature, the term "circuit" may be a device connected by at least one transistor and/or at least one active element by a predetermined means so as to process signals.

Figure 1:
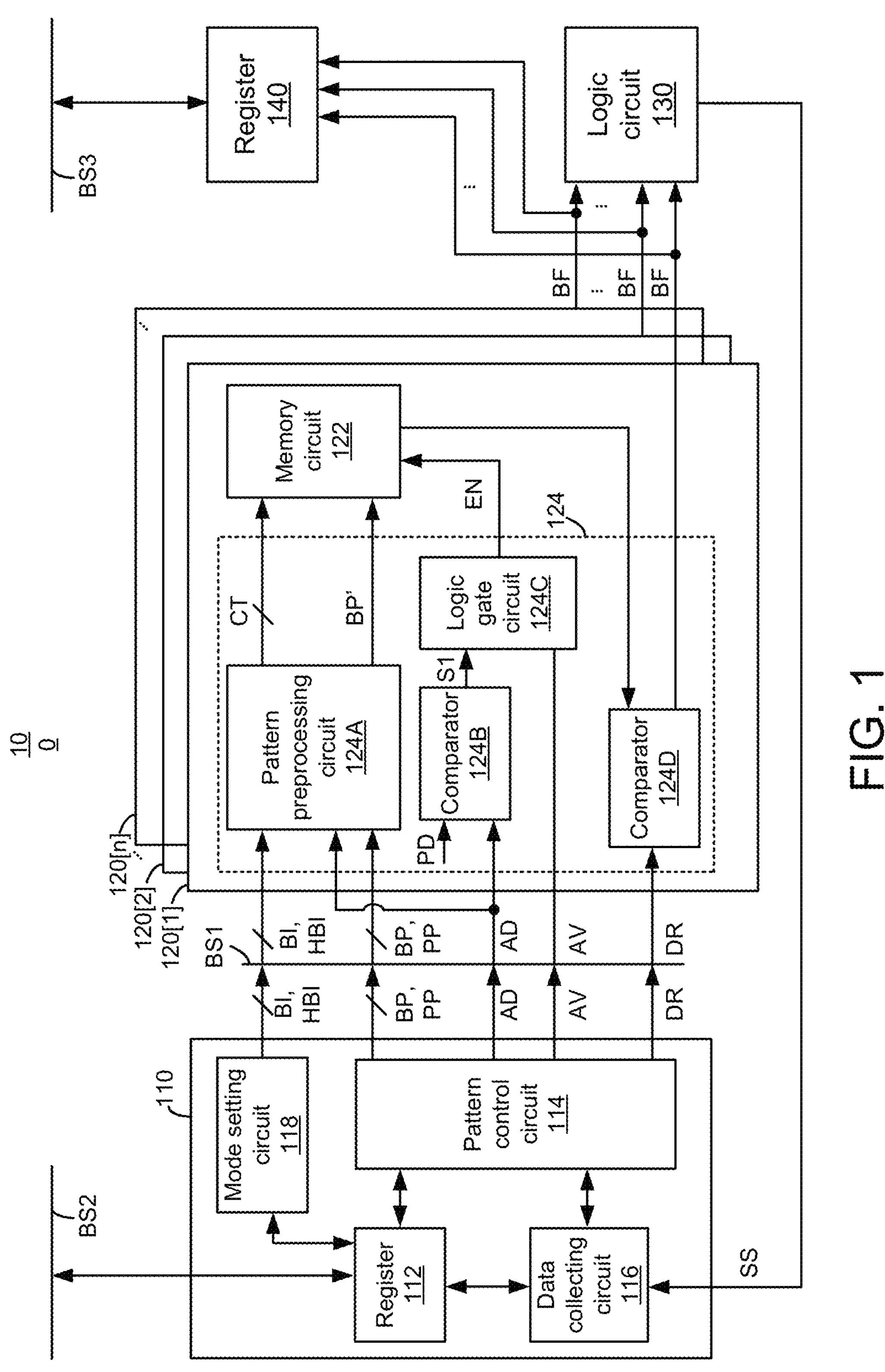
FIG. 1 is a schematic diagram of a memory device according to some embodiments of the present application.

FIG. 1 shows a schematic diagram of a memory device 100 according to some embodiments of the present application. The memory device 100 includes a pattern generating circuit 110, multiple memory modules 120[1] to 120[*n*], a logic circuit 130 and a register 140, wherein the value of n may be a positive integer greater than 1.

The pattern generating circuit 110 is configured to generate test pattern data BP, a test address AD and reference data DR, and transmit the multiple types of data above to the multiple memory modules 120[1] to 120[*n*] via a bus BS1, for the multiple memory modules 120[1] to 120[*n*] to perform a built-in self-test (BIST) according to the test pattern data BP, the test address AD and the reference data DR to generate multiple test results (denoted as signals BF). The logic gate 130 generates an indicator signal SS according to the multiple signals BF. In some embodiments, the logic gate 130 may be, for example but not limited to, an OR circuit.

More specifically, the pattern generating circuit 110 may include a register 112, a pattern control circuit 114, a data collecting circuit 116 and a mode setting circuit 118. The register 112 may receive signals from an external test machine (not shown) and/or other circuits (for example but not limited to, a register 140) via a bus BS2, so as to configure related parameters in the register 112. The pattern control circuit 114 may be configured according to the related parameters in the register 112 to generate the test pattern data BP, the test address AD, the reference data DR, an address validation signal AV and multiple sets of predetermined pattern data PP. The data collecting circuit 116 may receive the indicator signal SS from the logic circuit 130, and configure the register 112 upon receiving a predetermined logic value (for example, logic 1) included in the indicator signal SS, for the pattern control circuit 114 to retain the test address AD. The mode setting circuit 118 is configured by the related parameters in the register 112 to generate an inverting signal BI and an inverting signal HBI. In some embodiments, if the number of bits of one set of data stored in a memory module to be tested exceeds a predetermined value (for example but not limited to, 4), the mode setting circuit 118 may generate the inverting signal BI and the inverting signal HBI to provide an instruction for whether to logically invert the multiple sets of predetermined data PP. Related operation details of the above are to be described with reference to the flowchart in FIG. 2 below. In some embodiments, each circuit in the pattern circuit 110 may be implemented by at least one digital logic circuit.

Each of the memory modules 120[1] to 120[*n*] has the same circuit configuration as one another. Taking the memory module 120[1] for example, the memory module 120[1] includes a memory circuit 122 and a BIST circuit 124. In some embodiments, the memory circuit 122 may be, for example but not limited to, a static random access memory (SRAM) circuit. The BIST circuit 124 writes test data BP' to a memory cell in the memory circuit 122 corresponding to the test address AD according to the test address AD and the test pattern data BP, and reads the test data BP' from the memory 122 to compare the read test data BP' with the reference data DR, so as to generate the signal BF corresponding to the memory module 120[1], wherein the signal BF represents a test result of the memory module 120[1]. In other words, the test procedure above is a type of BIST. For example, if the read test data BP' is the same as the reference data DR, it means that functions of the memory cell corresponding to the test address AD to read data and write data are normal, and so the signal BF having a first logical value (for example but not limited to, logic 0) may be output, thereby indicating that the test result of the memory module 120[1] is fault-free. Alternatively, if the read test data BP' is different from the reference data DR, it means that the function of the memory cell corresponding to the test address AD to read data or write data is faulty, and so the signal BF having a second logical value (for example but not limited to, logic 1) may be output, thereby indicating that the test result of the memory module 120[1] indicates a fault.

In some embodiments, the BIST circuit 124 includes a pattern preprocessing circuit 124A, a comparator 124B, a logic gate circuit 124C and a comparator 124D. The pattern preprocessing circuit 124A decodes the test pattern data BP and the test address AD to generate multiple control signals CT and the test data BP' to be written, so as to control the memory circuit 122 to perform the BIST mentioned above. In some embodiments, the pattern preprocessing circuit 124A may further generate the corresponding test data BP' according to the inverting signal BI and the inverting signal HBI, so as to locate a faulty memory cell.

The comparator 124B is configured to compare the test address AD with a predetermined address PD to output a signal S1. For example, the predetermined address PD may be a largest (or last) in the memory circuit 122. If the test address AD is smaller than or equal to the predetermined address PD, the comparator 124B may output the signal S1 having a first logical value (for example, logic 1). Alternatively, if the test address AD is greater than the predetermined address PD, the comparator 124B may output the signal S1 having a second logical value (for example, logic 0) to disable the memory circuit 122. The logic gate circuit 124C may generate an enable signal EN according to the address validation signal AV and the signal S1 so as to enable the memory circuit 122 in a detection mode to be described shortly, for the memory circuit 122 to perform testing and locate the faulty memory cell according to the test address AD and the multiple sets of predetermined pattern data PP. In some embodiments, the logic gate circuit 124C may be, for example but not limited to, an AND circuit. The comparator 124D may read the written test data BP' from the memory circuit 122, and compare the read test data BP' with the reference data DR to generate the corresponding signal BF which corresponds to the test result of the memory module 120[1].

The register 140 may store the multiple signals BF generated by the multiple memory modules 120[1] to 120[*n*], and transmit these signals BF to an external test machine (not shown) or other analysis circuits (for example, but not limited to, the pattern generating circuit 110) via a bus BS3. Thus, whether the multiple memory modules 120[1] to 120[*n*] contain abnormalities can be determined according to the multiple signals BF generated by the BIST. For example, if the number of the multiple signals BF representing the test results indicating faults is small and these test results indicating faults uniformly correspond to these memory modules 120[1] to 120[*n*] (that is, the test results indicating faults are presented in a uniform manner), subsequent row detection and column detection do not need to be performed. Alternatively, if the number of signals BF representing the test results indicating faults is large and these signals BF correspond in a dense distribution to a specific memory module (for example, the memory module 120[1]), this specific memory module is selected to undergo the row detection and the column detection, thereby locating a faulty memory cell in this specific memory module. In different embodiments, the bus BS3 and the bus BS2 may be the same bus or different buses.

Figure 2:
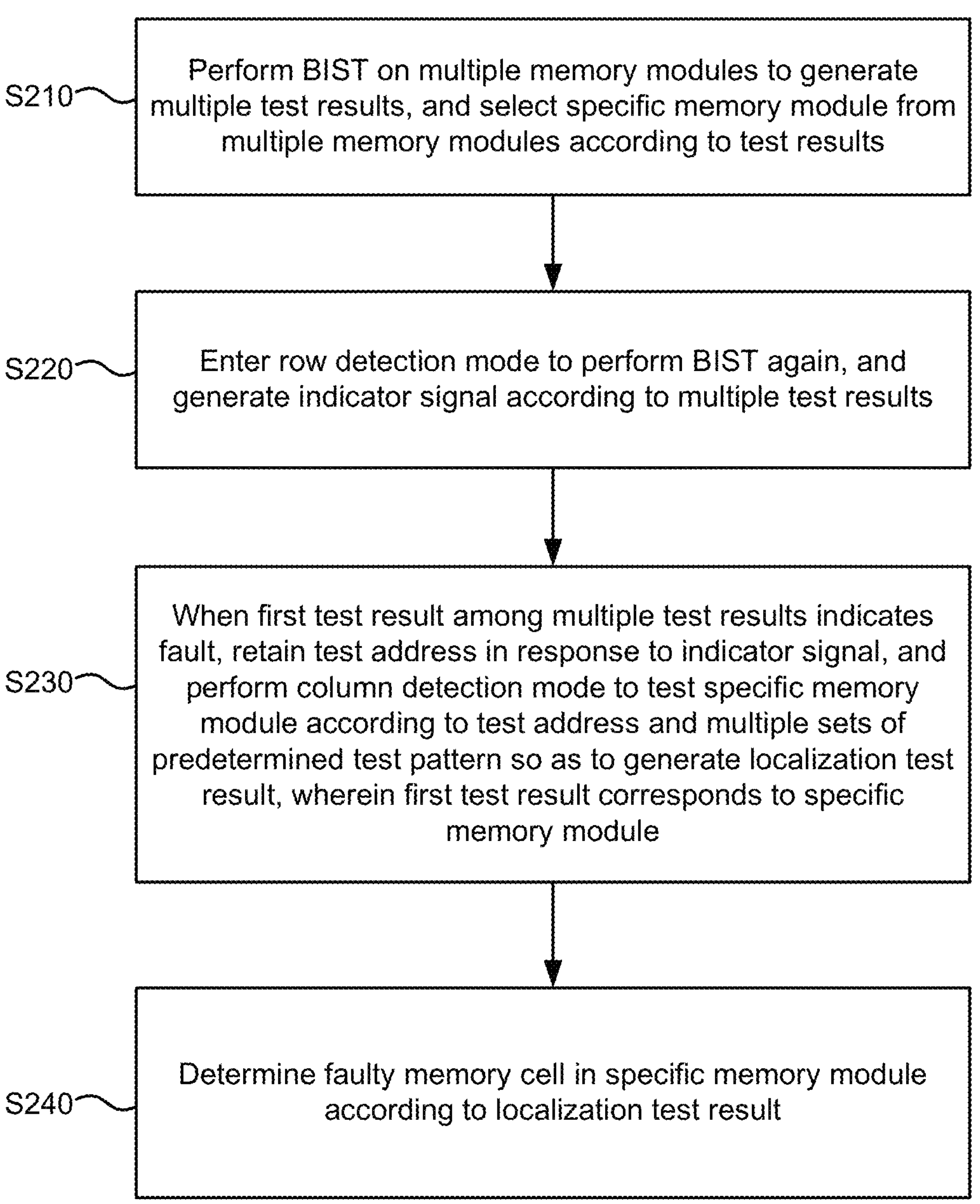
FIG. 2 is a flowchart of a memory testing method according to some embodiments of the present application.

FIG. 2 shows a flowchart of a memory testing method 200 according to some embodiments of the present application. In some embodiments, the memory testing method 200 may be performed by, for example, but not limited to, the memory device 100 in FIG. 1.

In operation S210, a BIST is performed on multiple memory modules to generate multiple test results, and a specific memory module is selected from the multiple memory modules according to the test results. For example, as shown in FIG. 1, the register 112 may receive an instruction via the bus BS1 to thereby configure related parameters therein, for the pattern control circuit 114 to generate the pattern data BP, the test address AD and the reference data DR. Thus, the multiple memory modules 120[1] to 120[*n*] may accordingly perform the BIST to thereby generate multiple signals BF representing the test results. As described above, by identifying the distribution of the multiple signals BF representing the test results indicating faults, a specific memory module containing a greater number of faults can be identified.

In operation S220, a row detection mode is entered, the BIST is performed again, the indicator signal is generated according to the multiple test results. In operation S230, when a first test result among the multiple test results indicates a fault, the test address is retained in response to the indicator signal, and a column detection mode is performed to test the specific memory module according to the test address and multiple sets of predetermined test patterns so as to generate a localization test result, wherein the first test result corresponds to the specific memory module. In operation S240, a faulty memory cell in the specific memory module is determined according to the localization test result.

For example, the register 112 may receive an instruction via the bus BS1 to thereby configure related parameters therein, for the pattern generating circuit 110 to operate in the row detection mode and perform the BIST in the row detection mode. Thus, the multiple memory modules 120[1] to 120[*n*] may accordingly perform the BIST to thereby generate multiple signals BF representing the test results. During the process above, if the test result (that is, the first test result) indicated by one of the multiple signals BF indicates a fault, the logic circuit 130 may generate the indicator signal SS having logic 1. In response to the indicator signal SS, the data collecting circuit 116 may configure related parameters of the register 112, for the pattern control circuit 114 to stop updating the test address AD and thus retain the test address AD. In other words, when the indicator signal SS shows a test result that indicates the presence of a fault, a memory row number corresponding to the current test address AD is a memory row that contains the fault. In some embodiments, a transmission delay (or a circuit operation delay) between the logic circuit 130 and the data collecting circuit 116 may be designed to be less than or equal to one logic gate delay so as to improve the accuracy in locating the memory row. In some embodiments, upon receiving the indicator signal SS having logic 1, the register 112 (or an external test machine) may reduce the currently retained test address AD by a constant value (depending on the actual circuit delay), so as to improve the accuracy in locating the memory row. Moreover, the external test machine (not shown) and/or other circuits may read the currently retained test address AD from the register 112, so as to determine the memory row number that contains a fault, thereby completing the row detection for the specific memory module.

Next, the register 112 may receive an instruction via the bus BS1 to thereby configure related parameters therein and the test address AD to be tested (that is, the test address AD obtained from the row detection), for the pattern generating circuit 110 to operate in a column detection mode and generate the address validation signal AV, the multiple sets of predetermined pattern data PP and the corresponding reference data DR in the column detection mode, so as to test the specific memory module above. In the column detection mode, according to the test address AD, the pattern control circuit 114 may learn the row number of the memory row that contains a fault, and write the multiple sets of predetermined pattern data PP to multiple columns of memory cells in the memory row that contains the fault, thereby locating a faulty memory cell. It should be understood that, in the column detection ode, the test results represented by the multiple signals BF generated by the BIST circuit 124 are the localization test result. In other words, the BIST circuit 124 may test the memory circuit 122 in the column detection mode according to the multiple sets of predetermined pattern data PP to generate the signal BF representing the localization test result. Correspondingly, the multiple signals BF stored in the register 140 in the column detection mode may be provided to an external test machine or other circuits via the bus BS3 for further analysis, thereby locating the faulty memory cell. In other words, in some embodiments, the BIST, the row detection and the column detection may be completed by repeatedly using the BIST circuit 124, thereby accurately locating the position of the faulty memory cell. Thus, without involving other addition circuits, the faulty memory cell can be accurately located to accordingly reduce a circuit area and overall testing costs.

It should be understood that, the operations in the row detection mode and the column detection mode are performed according to the related signals and data generated by the pattern generating circuit 110, and thus the various operations in the row detection mode and the column detection mode substantially test the multiple memory modules 120[1] to 120[*n*] (but not only a specific memory module). In some embodiments, a specific memory module containing a larger number of faults can be selected by the common BIST performed in operation S210, and memory row information and memory column information corresponding to the faulty memory cell can be further located by the operations in the row detection mode and the column detection mode in operation S220, operation S230 and operation S240. Equivalently speaking, with the multiple operations above, address information of a specific memory module and a faulty memory cell (that is, the memory column information and the memory row information above) can be located.

The multiple operations in FIG. 2 are merely examples, and are not limited to being performed in the order specified in this example. Without departing from the operation means and ranges of the various embodiments of the present application, additions, replacements, substitutions or omissions may be made to the operations in FIG. 2, or the operations may be performed in different orders (for example, performed simultaneously or partially performed simultaneously).

FIG. 3A shows a schematic diagram of results of column detection performed on a column of memory cells according to multiple sets of predetermined pattern data according to some embodiments of the present application. For better understanding, in this example, the number of memory columns of the memory circuit 112 is set to 4, that is, the number of bits of one set of data stored in the memory circuit 122 is 4 (for example, multiple bits B3, B2, B1 and B0 shown in FIG. 3). In this example, values corresponding to the multiple sets of pattern data PP may sequentially be 0, F, A, 5, 3 and C (represented in hexadecimal). If the value of the predetermined pattern data is 0, logic 0, logic 0, logic 0 and logic 0 are written to the multiple bits B3, B2, B1 and B0, respectively. Similarly, if the value of the predetermined pattern data is F, logic 1, logic 1, logic 1 and logic 1 are written to the multiple bits B3, B2, B1 and B0, respectively. Accordingly, the correspondence between the multiple sets of predetermined data PP and the multiple bits B3, B2, B1 and B0 can be understood.

In this example, assume that a fault occurs in the memory cell corresponding to the bit B3, and the type of this fault is a 'stuck-at fault'. For example, a node in the memory cell corresponding to the bit B3 is erroneously coupled to a power node, such that the bit B3 fixedly stores logic 1 corresponding to a high potential. In other words, the stuck-at fault is 'stuck at 1'. It is seen from FIG. 3 that, when the values of the multiple sets of pattern data PP are 0, 5, or 3, logic 0 (represented by dotted lines) should be written to the bit B3. However, being affected by the stuck-at fault, the bit B3 is still fixed at logic 1. Thus, in the column detection mode, it may be determined by analyzing the multiple signals BF that a data value (that is, logic 1) of the bit B3 is different from a corresponding data value (that is, logic 0) in the reference data DR, so that it is determined that the memory cell corresponding to the bit B3 contains a stuck-at fault and that the memory cell corresponding to the bit B3 is a faulty memory cell.

FIG. 3B shows a schematic diagram of a localization test result generated based on the multiple sets of predetermined pattern data PP according to some embodiments of the present application. In addition to detecting a stuck-at fault having a value stuck at 1, the multiple sets of predetermined pattern data PP may also be used to detect a stuck-at fault having a value stuck at 0. For example, when the values of the multiple sets of pattern data PP are F, A or C, logic 1 should be written to the bit B3. However, being affected by the stuck-at fault (stuck at 0), the bit B3 is still fixed at logic 0, and so the test result corresponding to the bit B3 indicates a fault when the values of the multiple sets of predetermined pattern data PP are A, F or C. Similarly, the test results shown in FIG. 3 can be derived according to different types of stuck-at faults occurring in different bits, wherein the value 1 indicates that the corresponding test result indicates a fault.

Also taking the bit B3 for example, as described above, if the memory cell corresponding to the bit B3 contains a stuck-at fault having a value stuck at 1, the test result of the memory cell indicates a fault (thus the corresponding test results are all recorded as a value 1) when the values of the multiple sets of predetermined pattern data PP are 0, 5 or 3. Similarly, if the memory cell corresponding to the bit B3 contains a stuck-at fault having a value stuck at 0, the test result of the memory cell indicates a fault (thus the corresponding test results are all recorded as a value 1) when the values of the multiple sets of predetermined pattern data PP are F, A or C. To quickly locate a faulty memory cell, the values 0, F, A, 5, 3 and C of the multiple sets of predetermined pattern data may sequentially correspond to different weights, for example, 32, 16, 8, 4, 2 and 1. A corresponding weighting sum may be obtained according to these weights and these test results having values recorded as 1. For example, if the stuck-at fault having a value stuck at 1 occurs in the memory cell corresponding to the bit B3, the corresponding weighting sum is 38 (that is, 32×1+4×1+2×1). Similarly, if the stuck-at fault having a value stuck at 0 occurs in the memory cell corresponding to the bit B3, the corresponding weighting sum is 25 (that is, 16×1+8×1+1×1). Accordingly, the localization test result in FIG. 3B may be obtained.

It is seen from FIG. 3B that, in some embodiments, the localization result may be one of multiple values (for example, 22, 41, 26, 37, 21, 42, 25 and 38 in FIG. 3B), and these values are weighting sums (or weighting totals) generated based on the stuck-at faults of the memory cells and the multiple sets of predetermined pattern data PP. In some embodiments, the multiple values above may be different from one another; that is, these values have uniqueness, and this effectively helps locating the memory cell corresponding to which bit contains a fault and indicating the fault type corresponding to the memory cell. In some embodiments, values corresponding to the localization test result may be determined by performing related analysis shown in FIG. 3B on the multiple signals BF stored in the register 140 in the column detection mode, so as to locate the faulty memory cell.

It should be noted that the values of the predetermined data PP are merely examples, and the present application is not limited to these examples. In different embodiments, any value combination capable of achieving the uniqueness above for assisting localization of a faulty memory cell may be set as the predetermined pattern data PP above.

FIG. 4A shows a schematic diagram of the test data BP' combined from the predetermined pattern data PP based on the inverting signal BI and the inverting signal HBI according to some embodiments of the present application. In some embodiments, if the number of bits (equivalent to the number of columns of the memory circuit 122) of one set of data stored in each of the memory modules 120[1] to 120[*n*] exceeds a predetermined value (for example, but not limited to, 4), the pattern generating circuit 110 may further generate the inverting signal BI and the inverting signal HBI, and each of the multiple memory modules 120[1] to 120[*n*] may combine the multiple set of predetermined test data PP into the test data BP' to perform testing according to the test data BP', so as to generate the localization test result. As described above, values of the multiple sets of pattern data PP may sequentially be 0, F, A, 5, 3 and C.

As shown in FIG. 4A, in this example, the number of bits of one set of data stored in each of the memory modules 120[1] to 120[*n*] is 16 (that is, the number of bits of one set of data stored in the memory circuit 122 includes 16 bits B0 to B16), and thus the BIST circuit 124 of each of the memory modules 120[1] to 120[*n*] may combine the multiple sets of predetermined pattern data PP (having values represented as 0, F, A, 5, 3 and C) into a test vector TV, and duplicate the test vector to generate a byte BT1 and a byte BT2 of the test data BP', wherein the byte BT1 is for writing data of the multiple bits B8 to B15 and the byte BT2 is for writing data of the multiple bits B0 to B7. The BIST circuit 124 of each of the memory modules 120[1] to 120[*n*] may selectively logically invert the byte BT1 according to the inverting signal BI, and selectively logically invert a half of the bits of the byte BT1 and a half of the bits of the byte BT2 according to the inverting signal HBI.

More specifically, when both of the inverting signal BI and the inverting signal HBI are logic 0, the byte BT1 and the byte BT2 are not inverted, and so the data in the byte BT1 and the byte BT2 is still represented by the original test vector TV (that is, the patterns corresponding to every 4 bits are still 0, F, A, 5, 3 and C). When the inverting signal BI is logic 0 and the inverting signal HBI is logic 1, a half of the bits of the byte BT1 and a half of the bits of the byte BT2 are logically inverted, and so the patterns corresponding to the most significant bits (for example, the bit B12 to the bit B15) in the byte BT1 and the patterns corresponding to the most significant bits (for example, the bit B4 to the bit B7) in the byte BT2 are all changed to F, 0, 5, A, C and 3. When the inverting signal BI is logic 1 and the inverting signal HBI is logic 0, the byte BT1 is logically inverted while the byte BT2 is kept unchanged, and so the patterns in the byte BT1 are all changed to F, 0, 5, A, C and 3. Similarly, when the inverting signal BI is logic 1 and the inverting signal HBI is logic 1, the byte BT1 is first logically inverted and then the patterns corresponding to the most significant bits (for example, the bit B12 to the bit B15) in the byte BT1 are again logically inverted. Thus, in the byte BT1, the patterns corresponding to the multiple bits B8 to B11 are changed to F, 0, 5, A, C and 3, and the patterns corresponding to the multiple bits B12 to B15 are changed to 0, F, A, 5, 3 and C; in the byte BT2, the patterns corresponding to the multiple bits B4 to B7 are changed to F, 0, 5, A, C and 3.

FIG. 4B shows a schematic diagram of a localization test result generated based on the test data BP' in FIG. 4A according to some embodiments of the present application. In this example, similar to FIG. 4A, based on different values of the inverting signal BI and the inverting signal HBI, all of the test data BP' may be sequentially written to memory modules by four steps (denoted as step S51 to step S54) to thereby obtain the localization test result in FIG. 4B.

In this example, it is assumed that a stuck-at fault having a value stuck at 0 occurs in the bit B5. In FIG. 4B, the value 1 represents a test result indicating a fault, and the test result obtained in step S51 is inverted to the test result obtain in step S52. Since the test data BP' corresponding to the S51 differs from the test data BP' corresponding to step S52 in that whether the most significant bits in each of the byte BT1 and the byte BT2 are inverted, it may be accordingly determined that a fault memory cell possibly corresponds to the multiple bits B4 to B7 or the multiple bits B12 to B15. The test result obtained in step S51 is the same as the test result obtained in step S53. Since the test data BP' corresponding to step S51 differs from the test data BP' corresponding to step S52 in that whether the most significant bits in each of the byte BT1 and the byte BT2 are inverted, it means that whether the byte BT1 is logically inverted or not does not at all affect the test results of the bits B8 to B15. Thus, it may be concluded that the faulty memory cell possibly corresponds to the multiple bits B0 to B7 in the byte BT2. By combining all the information above, it can be determined that the faulty memory cell corresponds to the multiple bits B4 to B7. Finally, since the test data BP' is generated by combing the multiple sets of predetermined pattern data PP and the multiple sets of predetermined pattern data PP is for testing the memory modules in which one set of data is 4-bit in length, the test result of the 6th bit B5 is equivalent to the test result of the second bit B1 in FIG. 3B. With reference to FIG. 3B, it is seen that, under the condition that a stuck-at fault having a value stuck at 0 occurs in the bit B1, the test result obtained indicates a fault (denoted as a value 1) when the values of the test data BP' written in are F, A and 3. Similarly, based on the test result obtained in step S51, it can be determined that the memory cell corresponding to the bit B5 is the faulty memory cell, which has a stuck-at fault having a value stuck at 0.

Similarly, according to different memory column numbers, test data for testing memory modules having a greater number of columns can be generated by duplicating more test vectors TV and setting the inverting signal HB and the inverting signal HBI to have different values.

In some embodiments, the multiple signals BF stored in the register 140 when the common BIST is performed may be read by an external test machine or a computer to identify the specific memory module above. Similarly, in some embodiments, the multiple signals BF stored in the register 140 during an operation in the column detection mode may be read by an external test machine or a computer to locate a faulty memory cell (that is, the operation shown in FIG. 3B or FIG. 4B above). In some other embodiments, the memory device 100 may further include a monitoring circuit (not shown), which may analyze the multiple signals BF stored in the register 140 to perform the associated operations in the description above, thereby identifying the specific memory module and locating the faulty memory cell.

In conclusion, without significantly increasing a hardware area, the memory device and the memory testing method according to some embodiments of the present application are capable of effectively identifying a memory module containing a fault, locating a faulty memory cell causing the fault, and at the same time determining a fault type of the faulty memory cell. Thus, testing costs of a memory may be effectively reduced.

While the present application has been described by way of example and in terms of the preferred embodiments, it is to be understood that the disclosure is not limited thereto. Various modifications made be made to the technical features of the present application by a person skilled in the art on the basis of the explicit or implicit disclosures of the present application. The scope of the appended claims of the present application therefore should be accorded with the broadest interpretation so as to encompass all such modifications.

What is claimed is:

1. A memory device, comprising:

a pattern generating circuit, generating test pattern data, a test address and reference data;

a plurality of memory modules, performing a built-in self-test (BIST) according to the test pattern data, the test address and the reference data to generate a plurality of test results; and a logic circuit, generating an indicator signal according to the plurality of test results;

wherein, when a first test result among the plurality of test results indicates a fault, the pattern generating circuit retains the test address in response to the indicator signal, and tests, according to the test address and a plurality of sets of predetermined pattern data, a first memory module among the plurality of memory modules that corresponds to the first test result, so as to determine a faulty memory cell in the first memory module according to a localization test result generated by the first memory module based on the plurality of sets of predetermined pattern data, wherein the pattern generating circuit further generates a first inverting signal and a second inverting signal to the first memory module, and the first memory module combines the plurality of sets of predetermined pattern data into test data according to the first inverting signal and the second inverting signal, and performs testing according to the test data to generate the localization test result.

2. The memory device according to claim 1, wherein when the first test result indicates a fault, the pattern generating circuit stops updating the test address in response to the indicator signal so as to retain the test address.

3. The memory device according to claim 1, wherein the localization test result is one of a plurality of values, and each of the plurality of values is a weighting sum generated based on stuck-at fault of the faulty memory cell and the plurality of sets of predetermined pattern data.

4. The memory device according to claim 1, wherein the first memory module combines the plurality of sets of predetermined pattern data into a test vector, duplicates the test vector to generate a first byte and a second byte of the test data, selectively logically inverts the first byte according to the first inverting signal, and selectively logically inverting a half of bits of the first byte and a half of bits of the second byte according to the second inverting signal.

5. The memory device according to claim 1, wherein the first memory module comprises:

a memory circuit; and a built-in self-test (BIST) circuit, writing test data to the memory circuit according to the test address and the test pattern data, reads the test data from the memory circuit, and compares the read test data with the reference data to generate the first test result.

6. The memory device according to claim 5, wherein the BIST circuit further tests the memory circuit based on the plurality of sets of predetermined pattern data to generate the localization test result.

7. The memory device according to claim 5, wherein the BIST circuit comprises:

a pattern preprocessing circuit, decoding the test pattern data and the test address so as to control the memory circuit to perform the BIST;

a first comparator, comparing the test address with a predetermined address to output a first signal;

a logic gate circuit, generating an enable signal according to an address validation signal and the first signal to enable the memory circuit to perform testing; and a second comparator, reading the test data from the memory circuit, and comparing the read test data with the reference data to generate the first test result.

8. A memory testing method, comprising:

generating, by a pattern generating circuit, test pattern data, a test address and reference data;

performing, by a plurality of memory modules, a built-in self-test (BIST) according to the test pattern data, the test address and the reference data to generate a plurality of test results;

generating an indicator signal according to the plurality of test results;

when a first test result among the plurality of test results indicates a fault, retaining, by the pattern generating circuit, the test address in response to the indicator signal, and testing, according to the test address and a plurality of sets of predetermined pattern data, a first memory module among the plurality of memory modules that corresponds to the first test result to generate a localization test result; and determining a faulty memory cell in the first memory module according to the localization test result, wherein when the first test result among the plurality of test results indicates a fault, the retaining of, by the pattern generating circuit, the test address in response to the indicator signal, and testing, according to the test address and a plurality of sets of predetermined pattern data, a first memory module among the plurality of memory modules that corresponds to the first test result to generate a localization test result comprises:

generating the localization test result based on a weighting sum from a stuck-at fault of the faulty memory cell and the plurality of sets of predetermined pattern data.

9. The memory testing method according to claim 8, wherein when the first test result among the plurality of test results indicates a fault, the retaining of, by the pattern generating circuit, the test address in response to the indicator signal, and testing, according to the test address and a plurality of sets of predetermined pattern data, a first memory module among the plurality of memory modules that corresponds to the first test result to generate a localization test result comprises:

when the first test result indicates a fault, stopping updating, by the pattern generating circuit, the test address in response to the indicator signal so as to retain the test address.

10. The memory testing method according to claim 8, further comprising:

further generating, by the pattern generating circuit, a first inverting signal and a second inverting signal to the first memory module, and combining, by the first memory module, the plurality of sets of predetermined pattern data into test data according to the first inverting signal and the second inverting signal, and performing testing according to the test data to generate the localization test result.

11. The memory testing method according to claim 10, further comprising:

combining, by the first memory module, the plurality of sets of predetermined pattern data into a test vector;

duplicating the test vector to generate a first byte and a second byte of the test data;

selectively logically inverting the first byte according to the first inverting signal; and selectively logically inverting a half of bits of the first byte and a half of bits of the second byte according to the second inverting signal.

12. A memory device, comprising:

a pattern generating circuit, generating test pattern data, a test address and reference data;

a plurality of memory modules, performing a built-in self-test (BIST) according to the test pattern data, the test address and the reference data to generate a plurality of test results; and a logic circuit, generating an indicator signal according to the plurality of test results;

wherein, when a first test result among the plurality of test results indicates a fault, the pattern generating circuit retains the test address in response to the indicator signal, and tests, according to the test address and a plurality of sets of predetermined pattern data, a first memory module among the plurality of memory modules that corresponds to the first test result, so as to determine a faulty memory cell in the first memory module according to a localization test result generated by the first memory module based on the plurality of sets of predetermined pattern data, wherein the pattern generating circuit comprises:

a register;

a pattern control circuit, configured by the register to generate the test pattern data, the test address, the reference data and the plurality of sets of predetermined pattern data; and a data collecting circuit, configuring the register according to the indicator signal for the pattern control circuit to retain the test address.

13. The memory device according to claim 12, wherein the pattern generating circuit further comprises:

a mode setting circuit, configured by the register to generate a plurality of inverting signals which provide an instruction for whether to logically invert the plurality of sets of predetermined pattern data.

* * * * *